(12) United States Patent
Ruettiger

(10) Patent No.: US 7,683,748 B2
(45) Date of Patent: Mar. 23, 2010

(54) CONTROL ELEMENT

(75) Inventor: Anton Ruettiger, Wildflecken (DE)

(73) Assignee: PREH GmbH (DE)

( * ) Notice: Subject to any disclaimer, the term of this patent is extended or adjusted under 35 U.S.C. 154(b) by 327 days.

(21) Appl. No.: 11/436,711

(22) Filed: May 19, 2006

(65) Prior Publication Data

US 2006/0227454 A1 Oct. 12, 2006

Related U.S. Application Data

(63) Continuation of application No. PCT/EP2004/012012, filed on Oct. 23, 2004.

(30) Foreign Application Priority Data

Nov. 20, 2003 (DE) ................. 103 54 376
May 8, 2004 (DE) ............... 10 2004 022 847

(51) Int. Cl.
*H01H 9/00* (2006.01)
(52) U.S. Cl. .............. 335/205; 335/206; 335/207
(58) Field of Classification Search .......... 335/205–207
See application file for complete search history.

(56) References Cited

U.S. PATENT DOCUMENTS

| | | | | |
|---|---|---|---|---|
| 4,054,860 A | * | 10/1977 | Henderson et al. | 338/32 H |
| 4,868,530 A | | 9/1989 | Ahs | |
| 5,280,145 A | * | 1/1994 | Mosier et al. | 200/313 |
| 5,421,694 A | * | 6/1995 | Baker et al. | 414/694 |
| 5,532,476 A | * | 7/1996 | Mikan | 250/221 |
| 5,608,386 A | * | 3/1997 | Murphy et al. | 340/688 |
| 5,656,982 A | * | 8/1997 | Kurahara | 335/205 |
| 5,664,667 A | * | 9/1997 | Kenmochi | 200/314 |
| 5,952,631 A | * | 9/1999 | Miyaki | 200/6 A |
| 6,188,332 B1 | * | 2/2001 | Scarlata | 341/35 |
| 6,262,646 B1 | * | 7/2001 | Van Zeeland | 335/205 |
| 6,294,906 B1 | * | 9/2001 | Kuechler | 323/371 |

(Continued)

FOREIGN PATENT DOCUMENTS

DE 39 22 071 A1 1/1991

(Continued)

OTHER PUBLICATIONS

Gary Weissenbacher, "Mensch—Maschine—Interface," Proseminar Softwar for automotove control devices, pp. 7-10.

*Primary Examiner*—Anh T Mai
*Assistant Examiner*—Mohamad A Musleh
(74) *Attorney, Agent, or Firm*—Cantor Colburn LLP

(57) ABSTRACT

The invention is directed to a control element, particularly in a central control unit. A magnet clamping system is integrated into a control element in order to render the function "slider setting" unequivocal. In addition to an actuator head that is positioned on a shaft, which is guided in a cylinder, for example, and at least one circuit board having LEDs, the control element includes a magnetic device having a designated magnet, which is functionally connected to the actuator head. When the actuator head is moved vertically by sliding, the magnetic device lifts off the magnet due to tilting, which causes a code disc attached to the actuator head to be brought into an inclined position such that a light flow on the light barriers formed by the LEDs is disrupted and/or opened up. In a further embodiment, this control element also includes press and rotate functions.

17 Claims, 5 Drawing Sheets

U.S. PATENT DOCUMENTS

| | | | |
|---|---|---|---|
| 6,542,058 B2 * | 4/2003 | Van Zeeland | 335/205 |
| 6,545,576 B1 * | 4/2003 | Marchini et al. | 335/205 |
| 6,641,480 B2 * | 11/2003 | Murzanski et al. | 463/38 |
| 6,664,666 B2 * | 12/2003 | Corcoran | 310/12 |
| 6,670,874 B1 * | 12/2003 | Galli | 335/205 |
| 7,038,667 B1 * | 5/2006 | Vassallo et al. | 345/184 |
| 7,126,072 B2 * | 10/2006 | Saitoh | 200/512 |
| 7,176,892 B2 * | 2/2007 | Kobayashi | 345/161 |
| 7,256,671 B1 * | 8/2007 | Preaux | 335/207 |
| 2004/0231434 A1 * | 11/2004 | Shibazaki et al. | 73/862.08 |
| 2005/0162389 A1 * | 7/2005 | Obermeyer et al. | 345/161 |
| 2006/0012584 A1 * | 1/2006 | Vassallo et al. | 345/184 |
| 2006/0274033 A1 * | 12/2006 | Ruettiger | 345/156 |
| 2006/0278011 A1 * | 12/2006 | Miyasaka et al. | 73/753 |
| 2006/0284710 A1 * | 12/2006 | Takatsuka et al. | 335/205 |

FOREIGN PATENT DOCUMENTS

| | | |
|---|---|---|
| DE | 101 52 978 A1 | 4/2003 |
| DE | 103 42 325 A1 | 4/2005 |
| DE | 103 42 335 A1 | 5/2005 |
| EP | 0 091 100 A2 | 10/1983 |
| EP | 0 570 870 A2 | 5/1993 |
| WO | WO 00/34965 | 6/2000 |

* cited by examiner

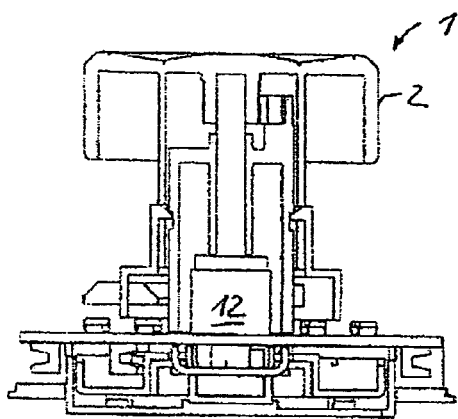 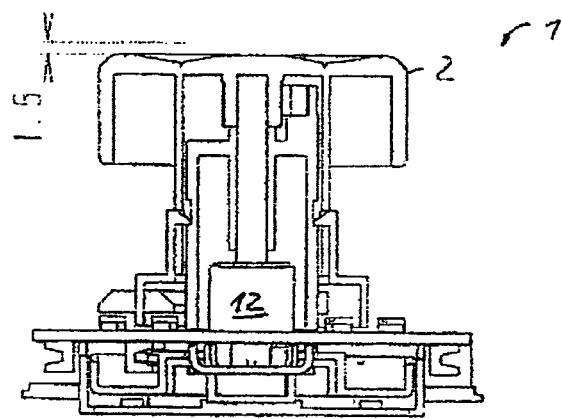
Fig. 3a  Fig. 3b
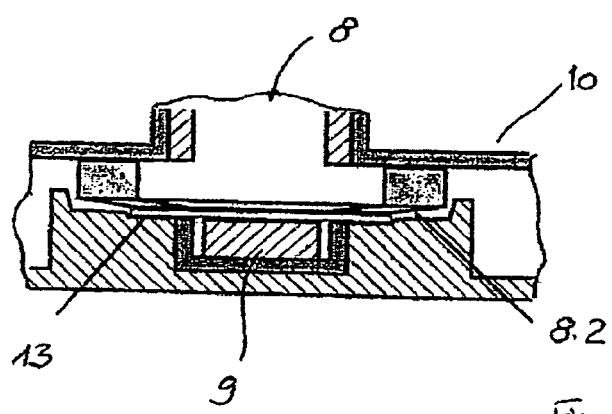
Fig. 1a

CONTROL ELEMENT

This nonprovisional application is a continuation of PCT/EP2004/012012, which was filed on Oct. 23, 2004, and which claims priority to German Patent Application Nos. DE 10354376.7 and DE 102004022847, which were filed in Germany on Nov. 20, 2003 and May 8, 2004, respectively, and which are all herein incorporated by reference.

BACKGROUND OF THE INVENTION

1. Field of the Invention

The present invention relates to a control element, particularly in a central control unit.

2. Description of the Background Art

From "Mensch-Maschine-Interface," Proseminar Software for automotive control devices, by Gary Weissenbacher, pages 7 to 10, a control element is disclosed, which in addition to rotate and press functions, is also provided with tilt and slide functions on the same operative plane.

With these conventional devices, the tilt and slide functions of the control knob or the actuator knob can lead to indefinable positions of the knob, and thus the function selection.

An activation element similar to a joystick with a preferably flat configuration, is disclosed in DE 101 52 978.3. The activation element is configured such that the activation knob can be brought, or pressed, into four different contact positions, whereby only one contact is made. A contact mat used in the activation element can be clipped onto a circuit board, and is a quadruple contact mat. In the contact center, space is provided in the contact mat for an LED so that the symbols on the activation element can be illuminated.

SUMMARY OF THE INVENTION

It is an object of the present invention to provide a concept that renders a positive definition of a function selection within a control element, in particular for tilt or slide settings.

According to an embodiment of the present invention, a magnetic clamp system is integrated into a control element, thus placing the function "Slider" into a positive position and preventing the selection of undefined intermediate positions. Preferably, the basic selection is done by way of a tilt core and permanent magnets. The tilt angle is measured during activation, for example, by way of an analogous light barrier, and in a preferred embodiment, can be adapted to a pre-programmed tilt line by an additional electromagnet. This electromagnet can be combined with a permanent magnet, for example, with the permanent magnet inside and the electromagnet positioned around it.

In a further embodiment of the invention, this control element can also be provided with additional functions like keying, pressing, and/or rotating. The press function in particular can be evaluated by an optodigital, optic analog, magnetic, or mechanical method.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 1a shows a magnetic structure instead of the steel core of FIG. 1;

FIGS. 3a, b illustrate the control element of FIG. 1 in a "Press" function position.

DETAILED DESCRIPTION

Figure 1:
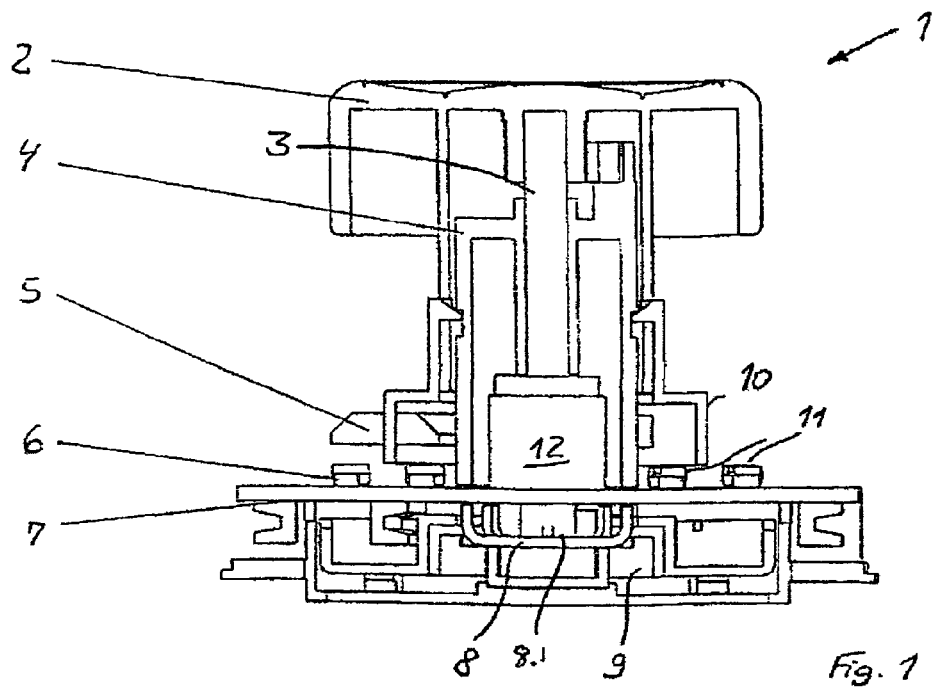
FIG. 1 shows a control element with a steel core in a rest-position.

In FIG. 1, a control element 1 having an actuator head 2, which is guided by a shaft rotary knob 3 in a non-rotating cylinder 4, is illustrated.

For the "Rotate" function, at least one light reflector 5 is provided in an encoder shaft, to which LEDs 6 of at least one circuit board 7 are dedicated. A magnetic device 8, which is functionally connected to the actuator head 2, for example an octagonal steel core 8.1 (octahedron or A-block) or a magnetic structure 8.2 comprised of eight interconnected facets (FIG. 1a), with an associated magnet 9, in the instant embodiment a permanent magnet. The magnetic device 8 can be positioned on a damping element 13. Preferably, the entire actuator head 2 (see FIG. 2b) is positioned centrically above the central permanent magnet 9. The steel core 8.1 is firmly pressed onto the cylinder 4, for example. Preferably, the circuit board 7 is provided with a recess, or a gap, in this area.

Figure 2A:
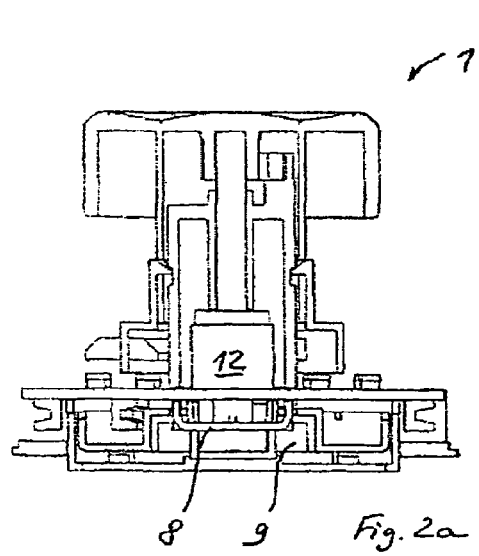
FIGS. 2a, b illustrate the control element of FIG. 1 in a "Slide" function position.
Figure 2B:
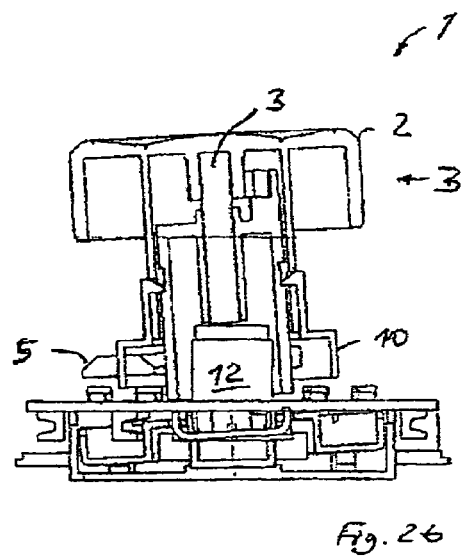

FIGS. 2a and 2b reflect the function "Slide" ("Tilt"). A force B thereby activates the actuator head 2 and attempts to slide it into a desired direction. During tilting, a steep increase of the impacting force occurs, which decreases thereafter to increase once again at the stop position via a rubber ring (not illustrated) attached to the cylinder 4. The tilting does not happen by way of a centric pivotal point, but occurs by way of a rim of the octagonal steel core 8.1. The shaft rotary knob is thereby lifted during the tilting operation. Relative to the centric pivotal point, the theoretically vertical relative movement of the actuator head 2 is thus reduced. On the one hand, the octagonal shape of the steel core 8.1 results in a preference for the eight primary directions, whereas on the other hand, the entire actuator head 2 is thereby centered. The tilting haptic is determined by the dimensions of the permanent magnet 9 and those of the steel core 8.1, that is, the haptic can be manipulated by altering these parameters. Preferably, this can also be done by adding an electromagnet (not shown in detail). The electromagnet is then located below the steel core 8.1, for example, and encloses the permanent magnet 9 in part or entirely. A code disc 10 attached to the actuator head 2 is put in an inclined position by the tilting action. The effect of this inclined position is that the light flow on several light barriers 11 formed by the LEDs 6 is disrupted and/or opened up. The principle is known from DE 103 42 335.4, which is herein incorporated by reference.

The evaluation of the sliding motion is preferably done by way of eight light barriers 11 located on the circuit board 7, whereby two light barriers 11 each are comprised of a mutual transmitter diode and two receivers. Preferably, the transmitter diodes are operated by pulsed power, which can guard against accelerated aging. Due to the code disc 10, for example, a backdrop mounted to the actuator head, in particular to the tilt element, three light barriers 11 are disrupted in one direction during the tilt action, and the operational direction is thus positively identified.

The rotate function is explained in more detail in FIG. 1. The actuator head 2 is radially positioned on the shaft rotary knob 3 in cylinder 4. Axially, an encoder shaft prevents the actuator head 2 from being pulled out. This is preferable done with notches (not illustrated in detail) on the encoder shaft, which thereby engage in a radial groove on cylinder 4, for example. A haptic locking piece, if one is desired, can be provided on the cylinder 4. During rotation, the actuator head 2 takes the encoder shaft along and disrupts, or closes off, a light passage between the LEDs 6 associated with the light barriers 11. This signal is then evaluated by the electronic (not illustrated in detail). The encoder shaft is preferably an optical guide (transparent) having one light reflector 5 each that is arranged in the appropriate locations, which causes the light emitted by the transmitter diode to be routed to the corresponding receiver diode. Thus, light reflector 5 and light passages are alternated accordingly at the periphery of the light guide. The number and arrangement of the LEDs 6 at an angle to one another thereby depends from the number of the click-stop positions to be adjusted, and can be calculated according to a conventional method. A coding such as this is also disclosed in non-published DE 103 42 325.7, which is herein incorporated by reference. In this optical encoder, the code disc is a special light guide.

The mechanical press function can be better described with the illustrations in FIGS. 3a and 3b. By way of the shaft rotary knob 3, the pressure force of the actuator head 2 is transferred to a pushbutton 12, or contact, located below the actuator head.

Figure 4A:
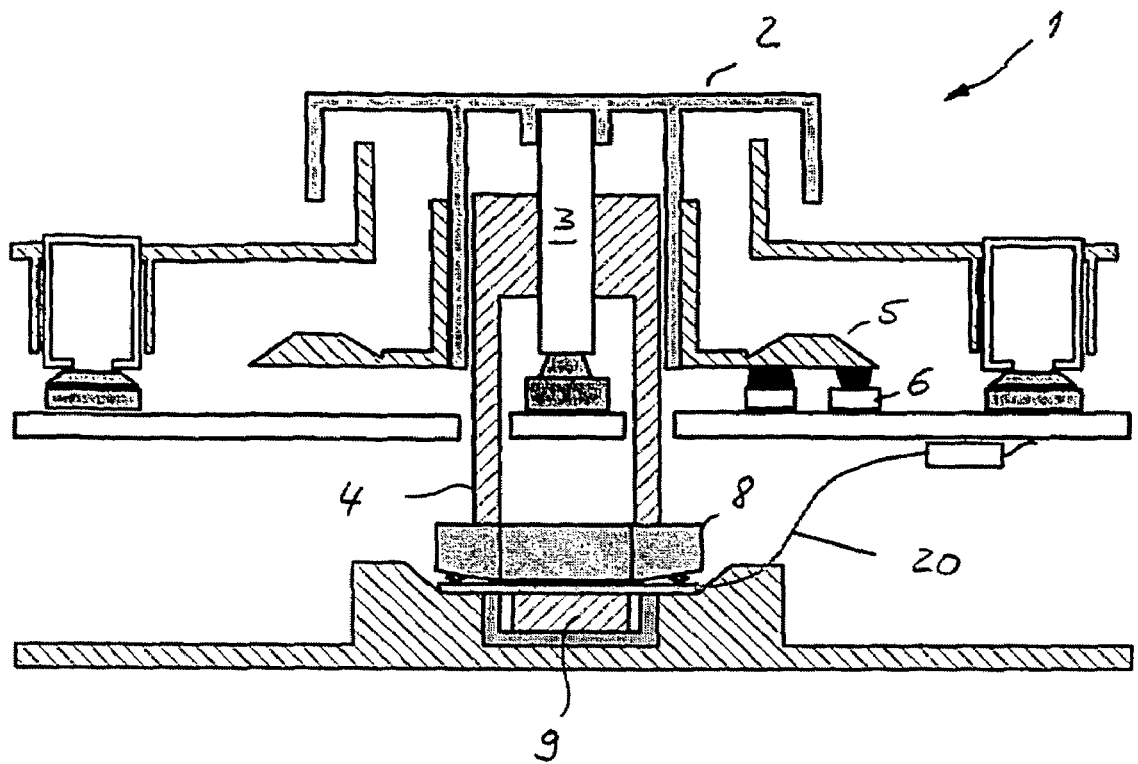
FIGS. 4a-4e show variations of the contact information for the "Press" function.
Figure 4B:
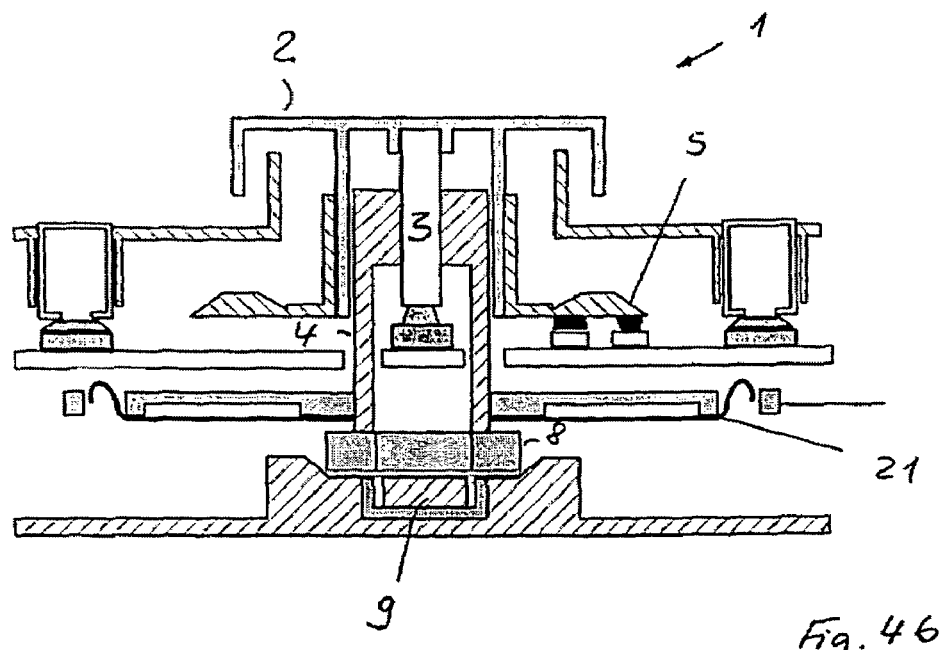

In FIGS. 4a, 4b, further mechanical contact variations are illustrated. For example, the integration of a switch foil 20 according to FIG. 4a is possible. Another variation is illustrated in FIG. 4b. The switch foil is thereby functionally replaced by contact springs 21.

Figure 4C:
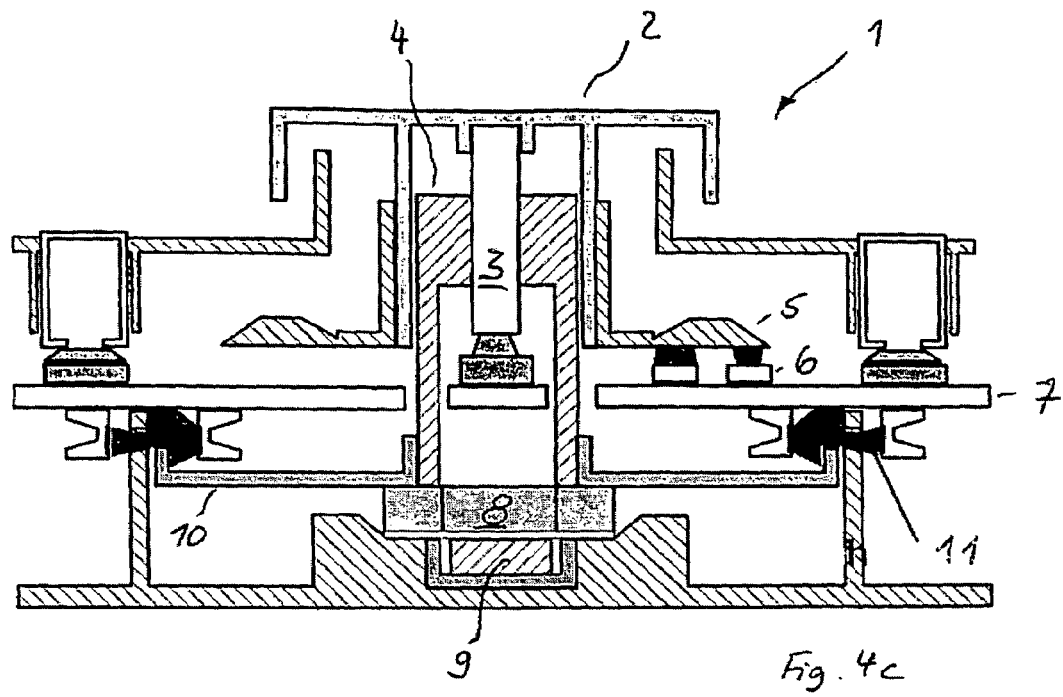
Figure 4D:
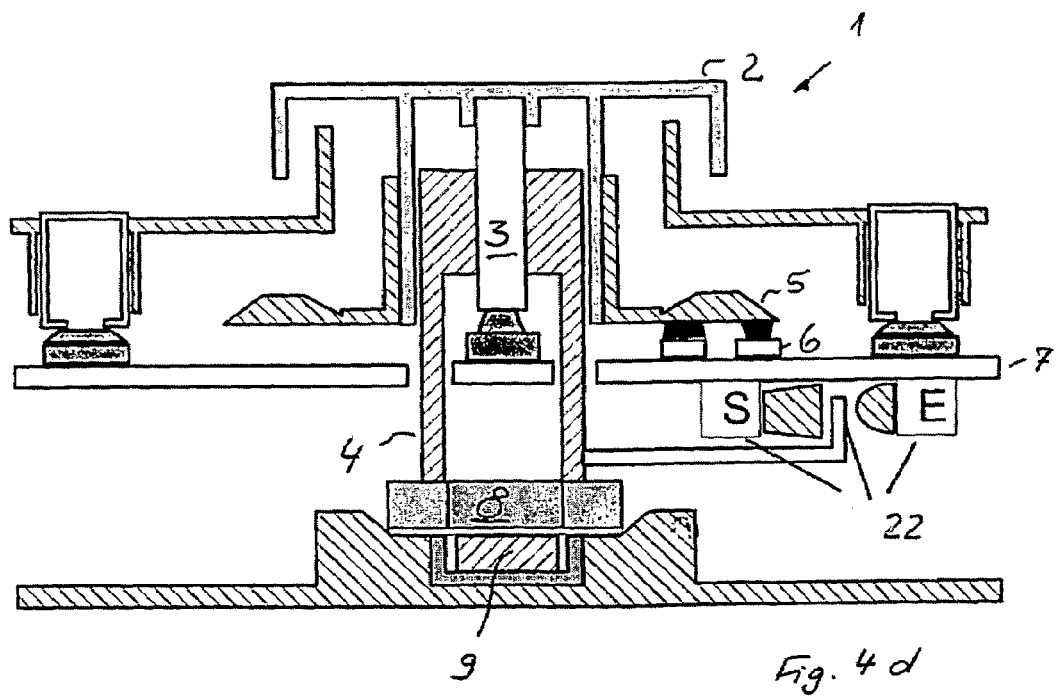
Figure 4E:
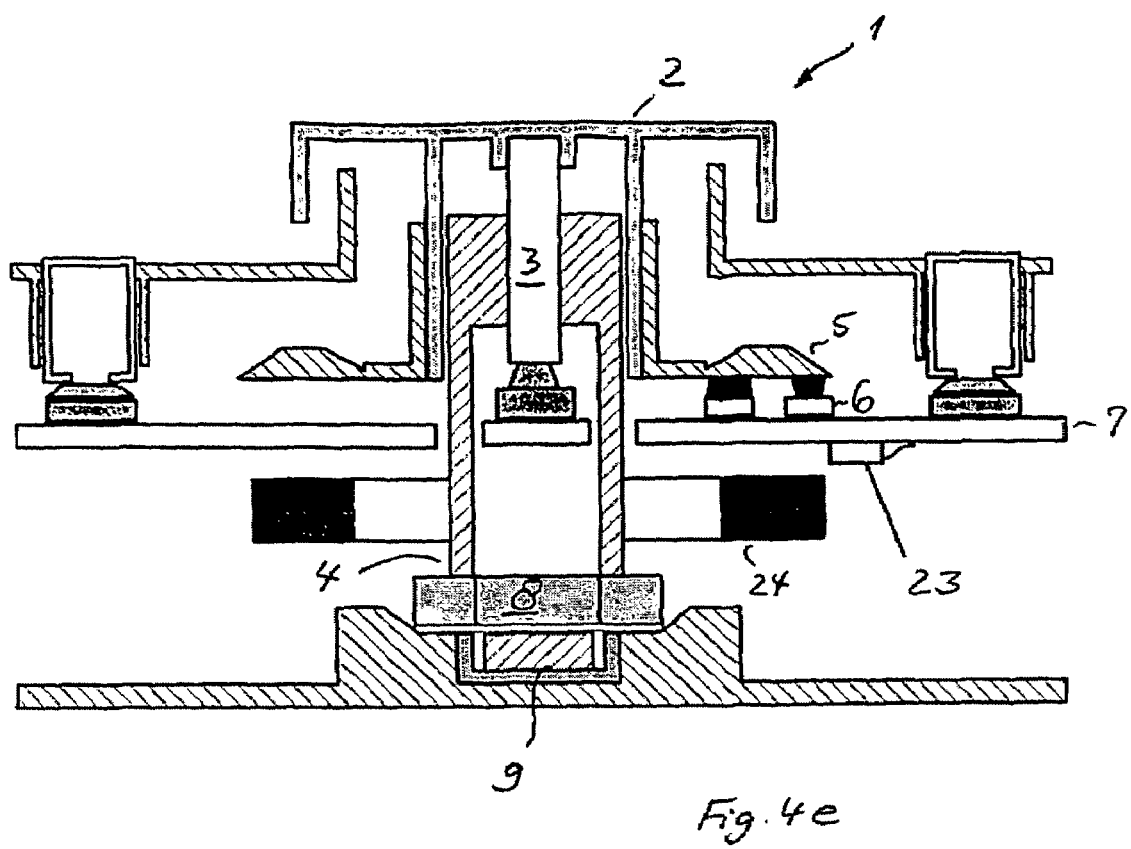

A touch-free variation is shown in FIG. 4c. The existing light barriers 11 of control element 1 can hereby be utilized. By using a plurality of light barriers 11, for example, four out of 8, that is, every second one, a pressure is detected when these four light barriers 11 are disrupted simultaneously. The advantage is in the simple evaluation. An optically analogous variation is shown in FIG. 4d. Preferably, two analogous light valves 22 at a 45-degree offset, comprised of at least one transmitter unit and at least one receiver unit, are therein used. FIG. 4e is based on using a Hall element 23 and a corresponding magnet 24 instead of the light valves.

The illumination of a provided search lighting feature for use at night can be done with an LED, which is integrated in the pushbutton 12, or the area thereof, below the shaft 3 (not illustrated in detail).

The suggested control element 1 can be incorporated in a central control unit (not illustrated in detail).

It is understood that further variations within the scope of the basic idea of the invention are possible. For example, magnet 9 can be replaced or complemented by an electromagnet (not shown in detail) with its known activation of a function. The principle of sliding the actuator head, however, though technically a tilting, but nevertheless still a sliding of the actual actuator head by the operator, remains to be a prerequisite. In other words, although the function is selected by tilting of the actuator head, the user still feels like he/she is sliding the actuator head.

Although the control element 1 comprises all three functions, customized combinations are possible.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A control element comprising:
   a shaft;
   an actuator head, which is positioned on the shaft;
   LEDs mounted on a circuit board for association with light barriers;
   a magnetic device connected to the actuator head, the magnetic device including designated magnet and magnetic material, whereby one of designated magnet and the magnetic material is attached to the shaft and at least partially displaced from the other of the designated magnet and the magnetic material by a displacement of the shaft relative to the circuit board when the actuator head is displaced; and
   a code disc attached to the actuator head to be inclined with the displacement of the actuator head, wherein, when the code disc is inclined, a light flow emitted by one or more of the LEDs toward the associated light barriers is disrupted and/or permitted by the code disc; wherein a pushbutton or contact located on the circuit board is operatively connected to the shaft.

2. The control element according to claim 1, wherein the magnetic material of the magnetic device is a steel core.

3. The control element according to claim 1, wherein the magnetic device is octagonal.

4. The control element according to claim 1, wherein the magnetic device is a magnetic structure comprised of eight interconnected facets.

5. The control element according to claim 1, wherein the designated magnet is a permanent magnet.

6. The control element according to claim 1, wherein the code disc is a backdrop mounted to the actuator head.

7. The control element according to claim 6, wherein the shaft encode is a light guide.

8. The control element according to claim 7, wherein the light guide is transparent, which on a peripheral side is alternately provided with light reflectors and light passages.

9. The control element according to claim 1, wherein the designated magnet is an electromagnet.

10. A control element comprising:
    a shaft;
    an actuator head on the shaft;
    LEDs mounted on a circuit board for association with light barriers;
    magnetic means for positioning the shaft relative to the LEDs, at least a portion of the magnetic means being connected to the actuator head, the magnetic means comprising at least one magnet and one magnetic element, whereby one of the magnet and the magnetic element is at least partially displaced relative to the other of the magnet and the magnetic element when the shaft is at least partially displaced relative to the circuit board; and
    a code disc connected to the shaft, wherein, when the shaft is at least partially displaced relative to the circuit board, a light flow emitted by the LEDs toward associated light barriers is disrupted or permitted or both disrupted and permitted by the code disc; wherein a pushbutton or contact located on the circuit board is operatively connected to the shaft.

11. The control element according to claim 10 wherein said magnetic element is octagonal.

12. The control element according to claim 10 wherein said magnet element comprises eight interconnected facets.

13. A control element comprising:
a shaft;
an actuator head on a first end of the shaft;
a disk connected to the shaft;
an LED mounted on a circuit board adjacent to the shaft;
a receiver configured to receive light from said LED;
a first magnetic element connected near a second end of the shaft; and
a second magnetic element located near the second end of the shaft adjacent said first magnetic element and releasably holding said shaft in a first position, said shaft being shiftable to a second position wherein said first magnetic element is at least partially displaced relative to said second magnetic element;
wherein, when said shaft is in one of said first and second positions, said disk blocks a beam of light from said LED from reaching said receiver, and when said shaft is in the other of said first and second positions, said disk allows the beam of light from said LED to reach said receiver; wherein a pushbutton or contact located on the circuit board is operatively connected to the shaft.

14. The control element according to claim 13 wherein said first magnetic element is octagonal.

15. The control element according to claim 13 wherein said first magnet element comprises eight interconnected facets.

16. The control element of claim 13 wherein the shaft is rotatable.

17. The control element of claim 13 wherein a diameter of said disk is greater than a diameter of said shaft.

* * * * *